(12) United States Patent
Wang

(10) Patent No.: US 6,351,363 B1
(45) Date of Patent: Feb. 26, 2002

(54) MULTI-STAGE POLYDIODE-BASED ELECTROSTATIC DISCHARGE PROTECTION CIRCUIT

(75) Inventor: Tai-Ho Wang, Hsinchu (TW)

(73) Assignee: Sunplus Technology Co. Ltd., Hsinchu (TW)

(*) Notice: Subject to any disclaimer, the term of this patent is extended or adjusted under 35 U.S.C. 154(b) by 0 days.

(21) Appl. No.: 09/328,849

(22) Filed: Jun. 9, 1999

(30) Foreign Application Priority Data

May 18, 1999 (TW) .................................. 88108048 A

(51) Int. Cl.[7] .................................................. H02H 3/22
(52) U.S. Cl. ........................... 361/111; 361/56; 361/58; 361/111
(58) Field of Search .................................. 361/111, 212, 361/56, 58, 117, 118, 119, 91.5; 257/173, 355, 656, 360

(56) References Cited

U.S. PATENT DOCUMENTS

| | | | |
|---|---|---|---|
| 4,616,404 A | * 10/1986 | Wang et al. | 29/576 |
| 5,139,959 A | * 8/1992 | Craft et al. | 437/31 |
| 5,343,053 A | * 8/1994 | Avery | 257/173 |
| 5,449,940 A | * 9/1995 | Hirata | 257/360 |
| 5,629,544 A | * 5/1997 | Voldman et al. | 257/355 |
| 5,716,880 A | * 2/1998 | Verma | 438/200 |
| 5,731,614 A | * 3/1998 | Ham | 257/355 |
| 5,767,550 A | * 6/1998 | Calafut et al. | 257/355 |
| 5,818,086 A | * 10/1998 | Lin et al. | 257/355 |
| 5,859,758 A | * 1/1999 | Kim | 361/111 |
| 5,946,177 A | * 8/1999 | Miller et al. | 361/56 |
| 5,982,600 A | * 11/1999 | Cheng | 361/111 |

FOREIGN PATENT DOCUMENTS

EP 0680089 A1 * 11/1995

* cited by examiner

Primary Examiner—Josie Ballato
Assistant Examiner—Vaughn Marquis
(74) Attorney, Agent, or Firm—J.C. Patents

(57) ABSTRACT

A multi-stage polydiode-based electrostatic discharge (ESD) protection circuit is provided for use in an IC device to protect the internal circuit of the IC device against ESD. In use, the multi-stage polydiode-based ESD protection circuit of the invention is provided between a bonding pad and the internal circuit of the IC device for the purpose of protecting the internal circuit of the IC device against any ESD voltage applied to the bonding pad. The multi-stage polydiode-based ESD protection circuit of the invention comprises: a plurality of stages of polydiode circuits; a plurality of resistors, each being connected between two neighboring stages of the polydiode circuits; and a power protection circuit connected between a high system voltage line and a low system voltage line. When ESD occurs, the resulted ESD current will be diverted by the polydiode circuits to the high system voltage line, and subsequently diverted by the power protection circuit to the low system voltage line, thus preventing the ESD current from entering into the internal circuit of the IC device. Moreover, with silicon dioxide layer serving as isolation between the polydiode structure and the underlying substrate, the ESD current is also presented from flowing to the substrate. The multi-stage polydiode-based ESD protection circuit thus can help provide adequate ESD protection against various types of ESD, including HBM (Human-Body Model), MM (Machine Model), and CDM (Charge-Device Model).

17 Claims, 4 Drawing Sheets

MULTI-STAGE POLYDIODE-BASED ELECTROSTATIC DISCHARGE PROTECTION CIRCUIT

CROSS-REFERENCE TO RELATED APPLICATION

This application claims the priority benefit of Taiwan application serial no. 88108048, filed May 18, 1999, the full disclosure of which is incorporated herein by reference.

BACKGROUND OF THE INVENTION

1. Field of the Invention

This invention relates to integrated circuit (IC) technology, and more particularly, to a multi-stage polydiode-based electrostatic discharge (ESD) protection circuit for use in an IC device to protect the internal circuit of the IC device against ESD.

2. Description of Related Art

The CMOS (Complementary Metal-Oxide Semiconductor) technology an advanced IC fabrication technology that combines both N-type and P-type MOS transistors on the same substrate to form logic gates or memory cells. However, CMOS-based IC devices are particularly susceptible to electrostatic discharge (ESD). When ESD occurs, the resulted ESD voltage would be typically greater than the system voltage used to drive the IC device, and therefore can easily break through the gate oxide layer in the CMOS structure, causing damage to the internal circuit of the IC device. To cope with ESD, CMOS-based IC devices are commonly provided with an ESD protection circuit to allow the IC device to be immune to ESD.

Polydiode is a semiconductor component now widely used in CMOS technology for the fabrication of many kinds of ICs, such as IC cards and smart cards. The polydiode is typically utilized as a rectifying element in bridge rectifying circuitry. However, since polydiode is typically unconnected to the IC substrate, it would be incapable of diverting ESD current, when it occurs, to the substrate. In terms of ESD protection, the polydiode can only provide a very limited capability. This is because that the polydiode would be nearly incapable of providing a protection capability above 1 KV (kilovolt) due to its inherent electrical characteristics, which makes it unsuitable for Human-Body Model (HBM) ESD protection and, needless to say, Machine Model (MM) and Charge-Device Model (CDM) protection.

Presently, polydiode-based IC devices are provided with only one stage of polydiode circuitry prior to the connection to the gate. This design scheme would offer only a very limited level of ESD protection. At the 2 μm level of fabrication process or above, it can provide a 750 V level of HBM ESD protection. However, at the submicron level of fabrication process or below, the HBM ESD protection would be reduced to only between 100 V to 500 V, which would make the IC device highly susceptible to ESD.

SUMMARY OF THE INVENTION

It is therefore an objective of this invention to provide a multi-stage polydiode-based ESD protection circuit, which can help improve the switching speed of the polydiode through the use of a finger-type polydiode so that ESD current can be more quickly drained away.

It is another objective of this invention to provide a multi-stage polydiode-based ESD protection circuit, which can help increase the ESD protection capability in submicron IC devices.

It is still another objective of this invention to provide a multi-stage polydiode-based ESD protection circuit, which can help provide adequate ESD protection against various types of ESD, including HBM, MM, and CDM.

In accordance with the foregoing and other objectives of this invention, a novel multi-stage polydiode-based ESD protection circuit is provided.

Broadly speaking, the invention is embodied as a multi-stage polydiode-based ESD protection circuit. In one preferred embodiment, the multi-stage polydiode-based ESD protection circuit is embodied as a 2-stage circuit.

In use, the multi-stage polydiode-based ESD protection circuit is provided between a bonding pad and the internal circuit of an IC device for the purpose of protecting the internal circuit of the IC device against any ESD voltage applied to the bonding pad. The multi-stage polydiode-based ESD protection circuit of the invention comprises: (a) a plurality of stages of polydiode circuits, each stage including a first polydiode and a second polydiode, the first polydiode having a positive end connected to a connecting node and a negative end connected to a first system voltage, and the second polydiode having a positive end connected to a second system breakdown voltage lower in level than the first system voltage and a negative end connected to the connecting node, with the connecting node in the first stage of polydiode circuit being connected to the bonding pad and the connecting node in the last stage of polydiode circuit being connected to the internal circuit of the IC device; (b) a plurality of resistors, each being used to connect one stage of polydiode circuit to the next stage of polydiode circuit in such a manner as to be connected between the connecting node of one stage of polydiode circuit and the connecting node of the next stage of polydiode circuit; and (c) a power protection circuit, connected between the first system voltage line and the second system voltage line, for draining ESD current on the first system voltage line to the second system voltage line.

When embodied as a 2-stage polydiode-based ESD protection circuit, it comprises: (a) a first stage of polydiode circuit including a first polydiode and a second polydiode, the first polydiode having a positive end connected to a first node connected to the bonding pad and a negative end connected to a first system voltage, and the second polydiode having a positive end connected to a second system breakdown voltage lower in level than the first system voltage and a negative end connected to the first node; (b) a resistor having a first end connected to the first node and a second end connected to a second node; (c) a second stage of polydiode circuit including a first polydiode and a second polydiode, the first polydiode having a positive end connected to the second node and a negative end connected to the first system voltage, and the second polydiode having a positive end connected to the second system voltage and a negative end connected to the second node; and (d) a power protection circuit, connected between the first system voltage line and the second system voltage line, for draining ESD current on the first system voltage line to the second system voltage line.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
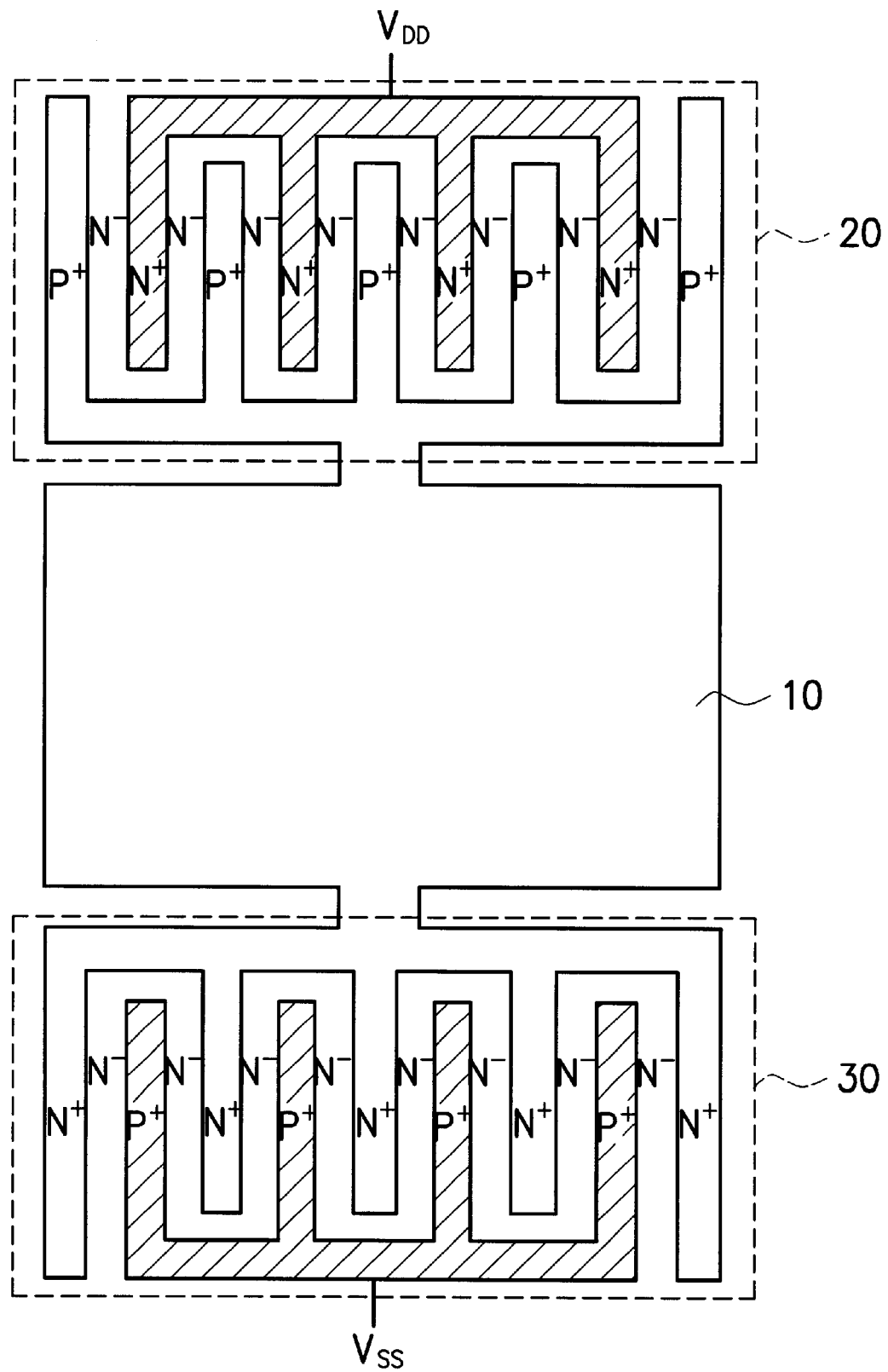
FIG. 1A is a schematic diagram showing a top view of the IC layout of a finger-type polydiode.
Figure 1B:
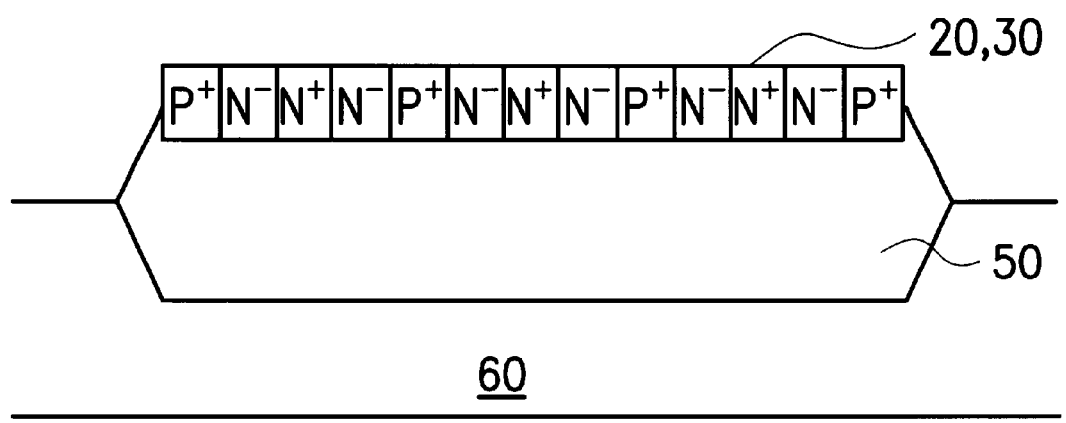
FIG. 1B is a schematic diagram showing a cross-sectional view of the finger-type polydiode of FIG. 1A.

FIG. 1A is a schematic diagram showing a top view of the IC layout of one single stage of polydiode circuit utilized in the ESD protection circuit of the invention. As shown, the polydiode circuit includes two polydiodes 20, 30 which are connected to a common bonding pad 10. The polydiodes 20, 30 each include a $P^+$ part, an $N^+$ part, and an $N^-$ part disposed between the $P^+$ part and the $N^+$ part, with the $P^+$ part and the $N^+$ part being each shaped substantially like a plurality of fingers. Referring also to FIG. 1B, each of the polydiodes 20, 30 in the polydiode circuit of FIG. 1A is constructed on a field oxide layer 50 formed on a semiconductor substrate 60. With the provision of the silicon dioxide layer 50, the ESD current flowing into the polydiodes 20, 30 would be prevented from flowing into the substrate 60.

Figure 2:
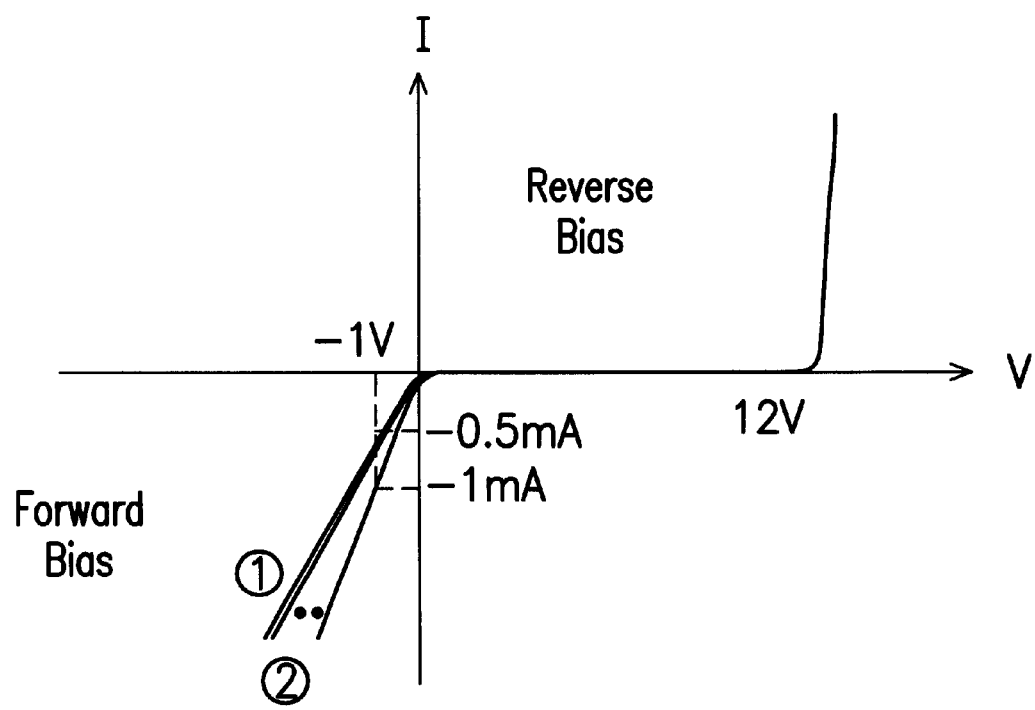
FIG. 2 is a graph, showing the I-V characteristics of the finger-type polydiode.

FIG. 2 is a graph showing the I-V (current-versus-voltage) characteristics of the finger-type polydiode shown in FIGS. 1A and 1B. As shown, when the applied voltage is −1 V, the forward current is about from 0.5 mA to 1 mA (milliampere). The I-V characteristic can be varied by varying the width of the $N^-$ part of the finger-type polydiode. In accordance with the invention, the finger-type polydiode is provided in multiple stages (shown in FIG. 4), with the first stage having an $N^-$ part width of L, the second stage having an an $N^-$, part width of L−ΔL, the third stage having an $N^-$ part width of L−2·ΔL, . . . , and the (n)th stage having an $N^-$ part width of L−(n−1)·ΔL, where 0 ≦(n−1)·ΔL≦1 μm. This allows the last-stage polydiode circuit to possess the lowest voltage threshold, allowing it to be more easily switched on by a small amount of ESD current.

Figure 3:
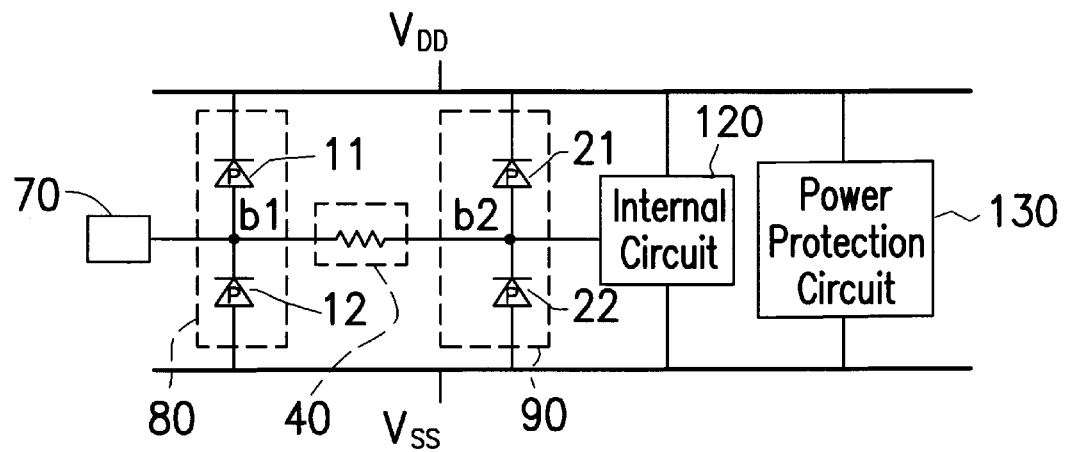
FIG. 3 is a schematic diagram showing the circuit structure of the multi-stage polydiode-based ESD protection circuit according to the invention when embodied as a 2-stage circuit.

FIG. 3 is a schematic diagram showing the circuit structure of the multi-stage polydiode-based ESD protection circuit of the invention when embodied as a 2-stage circuit. As shown, the 2-stage polydiode-based ESD protection circuit is intended for ESD protection on the internal circuit 120 of an IC device, and comprises a bonding pad 70, a first stage of polydiode circuit 80, a resistor 40, a second stage of polydiode circuit 90, and a power protection circuit 130.

The first stage of polydiode circuit 80 includes a first polydiode 11 and a second polydiode 12 (which are equivalent to the polydiodes 20, 30 shown in FIG. 1A), wherein the first polydiode 11 has a positive end connected to a first node b1 and a negative end connected to a first system voltage $V_{DD}$ (which is a high voltage), while the second polydiode 12 has a positive end connected to a second system voltage $V_{ss}$ (which is a low voltage such as the ground) and a negative end connected to the first node b1.

In a similar manner, the second stage of polydiode circuit 90 includes a first polydiode 21 and a second polydiode 22 (which are also equivalent to the polydiodes 20, 30 shown in FIG. 1A), wherein the first polydiode 21 has a positive end connected to a second node b2 and a negative end connected to the first system voltage $V_{DD}$, while the second polydiode 22 has a positive end connected to the second system voltage $V_{ss}$ and a negative end connected to the second node b2.

In the event that the bonding pad 70 is subjected to an ESD voltage greater than $V_{DD}$, it will cause the first polydiode 11 in the first stage of polydiode circuit 80 to be forward biased, thereby allowing the ESD current from the bonding pad 70 to be diverted to the $V_{DD}$ voltage line and subsequently flow through the power protection circuit 130 to the $V_{ss}$ voltage line.

In the event that the ESD current from the bonding pad 70 is not entirely diverted by the first stage of polydiode circuit 80 to the $V_{DD}$ voltage line, the remaining part of the ESD current will flow through the resistor 30 to the second stage of polydiode circuit 90. Since the first polydiode 21 in the second stage of polydiode circuit 90 has a lower voltage threshold than the first polydiode 11 in the first stage of polydiode circuit 80, the remaining ESD voltage would nevertheless be able to turn on the first polydiode 21 in the second stage of polydiode circuit 90, thereby allowing the remaining ESD current to be diverted by the first polydiode 21 in the second stage of polydiode circuit 90 to the $V_{DD}$ voltage line and subsequently flow through the power protection circuit 130 to the $V_{ss}$ voltage line.

Figure 4:
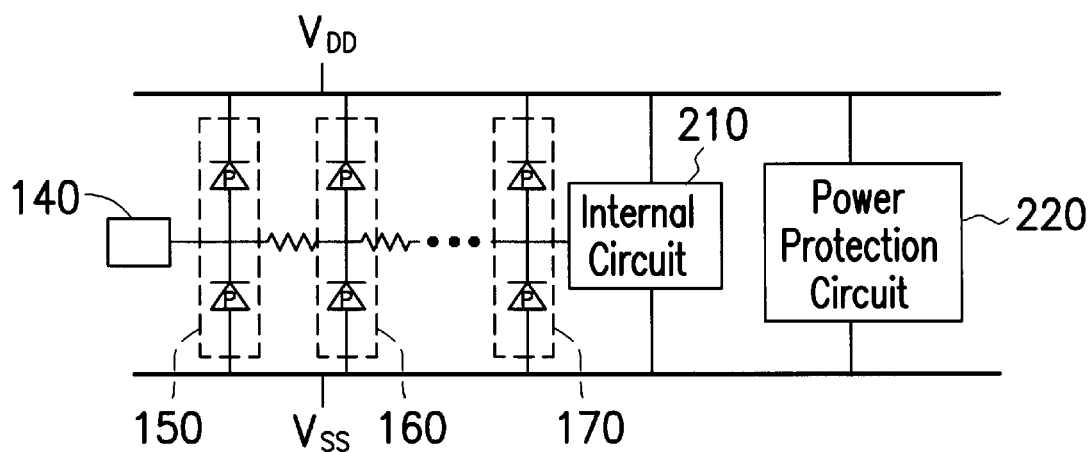
FIG. 4 is a schematic diagram showing the circuit structure of the multi-stage polydiode-based ESD protection circuit according to the invention.

The embodiment of FIG. 3 shows the use of two stages of polydiode circuits 80, 90. Fundamentally, the more the number of stages used, the more is the ESD protection capability. FIG. 4 is a schematic diagram showing the circuit structure of the multi-stage polydiode-based ESD protection circuit according to the invention, which includes more than two stages of polydiode circuits, including a first stage of polydiode circuit 150, a second stage of polydiode circuit 160, . . . , and an (n)th stage of polydiode circuit 170, where n≧3.

From actual test, it can be found that, at the 0.8 μm level of fabrication, the multi-stage polydiode-based ESD protection circuit of the invention can provide the following levels of ESD protection in HBM, MM, and CDM:

HBM>1.5 KV

MM>125 V

CDM>600 V which are considerably better than the prior art.

Figure 5A:
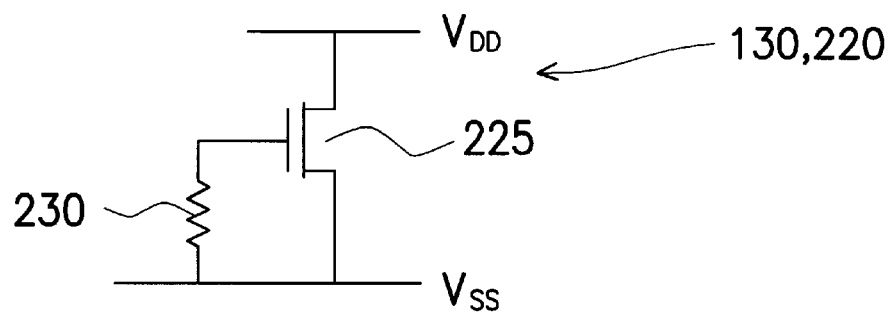
FIG. 5A is a schematic diagram showing a first example of the inside circuit structure of the power protection circuit utilized in the multi-stage polydiode-based ESD protection circuit of the invention.
Figure 5B:
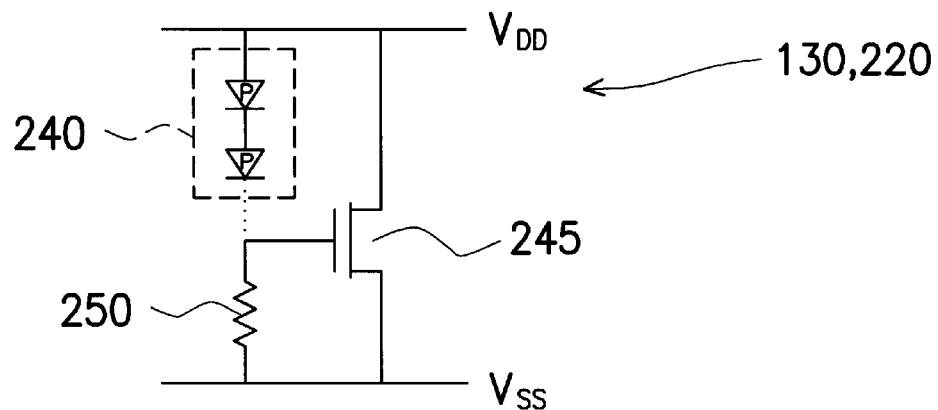
FIG. 5B is a schematic diagram showing a second example of the inside circuit structure of the power protection circuit utilized in the multi-stage polydiode-based ESD protection circuit of the invention.
Figure 5C:
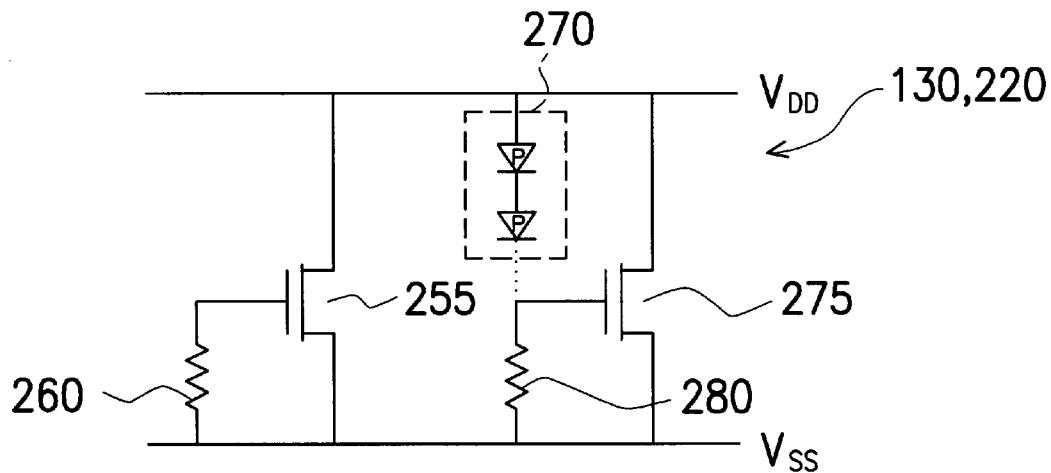
FIG. 5C is a schematic diagram showing a third example of the inside circuit structure of the power protection circuit utilized in the multi-stage polydiode-based ESD protection circuit of the invention.

In the ESD protection circuit of the invention, the power protection circuit 130 in FIG. 3 (or the power protection circuit 220 in FIG. 4) can be realized in various ways, respectively disclosed in reference to FIGS. 5A, 5B, and 5C.

FIG. 5A is a schematic diagram showing the first example of the inside circuit structure of the power protection circuit 130, or 220, utilized in the multi-stage polydiode-based ESD protection circuit of the invention. As shown, the power protection circuit includes a MOS transistor 225 whose source and drain are connected between $V_{DD}$ and $V_{ss}$ and whose gate is connected via a resistor 230 to $V_{ss}$. Under normal conditions (i.e., no ESD occurs), the MOS transistor 225 is set OFF. In the event of ESD, the ESD current diverted to the $V_{DD}$ voltage line will cause the MOS transistor 225 to be switched ON, thereby allowing the ESD current in the $V_{DD}$ voltage line to flow through the MOS transistor 225 to the $V_{ss}$ voltage line. In this embodiment, the resistor 230 should be greater than 5 KΩ.

FIG. 5B is a schematic diagram showing the second example of the power protection circuit. As shown, this power protection circuit also includes a MOS transistor 245 and a resistor 250, which are configured in the same manner as FIG. 5A. This power protection circuit differs from the one shown in FIG. 5A particularly in the additional provision of a cascaded diode circuit 240 whose positive end is connected to the $V_{DD}$ voltage line and whose negative end is connected to the gate of the MOS transistor 245 for the purpose of providing a substantially fixed gate voltage to the MOS transistor 245. The cascaded diode circuit 240 includes a plurality of serially-connected diodes, each being connected in such a manner that its positive end is connected to the positive end of the previous diode and its negative end is connected to the positive end of the next diode, with the positive end of the first diode being connected to the $V_{DD}$ voltage line and the negative end of the last diode being connected to the gate of the MOS transistor 245. The cascaded diode circuit 240 is used to maintain the gate voltage at 5V to 6V.

FIG. 5C is a schematic diagram showing the third example of the power protection circuit. Similar to the foregoing example, this power protection circuit also includes a MOS transistor 275, a resistor 280, and a cascaded diode circuit 270, which are configured in the same manner as FIG. 5B. This power protection circuit differs from the one shown in FIG. 5B particularly in that another MOS transistor 255 and a resistor 260 are additionally connected between the $V_{DD}$ voltage line and the $V_{ss}$ voltage line, which are configured in the same manner as the circuit shown on FIG. 5A. This provides two diverting routes to the ESD current in the $V_{DD}$ voltage line, so that the drainage of the ESD current can be performed more efficiently.

In conclusion, the invention provides a multi-stage polydiode-based ESD protection circuit which has the following features and advantages.

First, the invention utilizes a finger-type polydiode arranged in pair and in a multi-stage manner that allows an improvement on the switching speed, so that ESD current can be more quickly drained away.

Second, the invention provides a multi-stage polydiode-based ESD protection circuit to the input side of the internal circuit of the IC device intended to be protected against ESD, with the first stage being connected to the input bonding pad and the last stage connected to the input side of the internal circuit of the IC device, allowing all kinds of ESD currents, whether HBM, MM, or CDM, to be diverted away efficiently.

Third, the invention further makes use of a power protection circuit which serves as an additional ESD drainage route, allowing the ESD drainage to be more efficiently performed.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An ESD protection circuit provided between a bonding pad and the internal circuit of an IC device for the purpose of protecting the internal circuit of the IC device against any ESD voltage applied to the bonding pad; the 2-stage polydiode-based ESD protection circuit comprising:
   a first stage of polydiode circuit including a first polydiode and a second polydiode, the first polydiode having a positive end connected to a first node connected to the bonding pad and a negative end connected to a first system voltage, and the second polydiode having a positive end connected to a second system voltage lower in level than the first system voltage and a negative end connected to the first node, wherein the first polydiode and the second polydiode each include a P$^+$ part, an N$^+$ part, and an N$^-$ part disposed between the P$^+$ part and the N$^+$ part;
   a resistor having a first end connected to the first node and a second end connected to a second node;
   a second stage of polydiode circuit including a first polydiode and a second polydiode, the first polydiode having a positive end connected to the second node and a negative end connected to the first system voltage, and the second polydiode having a positive end connected to the second system voltage and a negative end connected to the second node, wherein the first polydiode and the second polydiode each include a P$^+$ part, an N$^+$ part, and an N$^-$ part disposed between the P$^+$ part and the N$^+$ part; and
   a power protection circuit, connected between the first system voltage line and the second system voltage line, for draining ESD current on the first system voltage line to the second system voltage line
   wherein a width of the N$^-$ part of the first stage of polydiode is larger than a width of the N$^-$ part of the second stage of polydiode.

2. The circuit of claim 1, wherein the power protection circuit includes:
   a MOS transistor whose source is connected to the first system voltage line and whose drain is connected to the second system voltage line;
   a resistor having a first end connected to the gate of the MOS transistor and a second end connected to the second system voltage line; and
   a cascaded diode circuit having a positive end connected to the first system voltage line and a negative end connected to the gate of the MOS transistor for providing a substantially fixed gate voltage to the MOS transistor.

3. The circuit of claim 2, wherein the cascaded diode circuit includes a plurality of serially-connected diodes, each being connected in such a manner that its positive end is connected to the negative end of the previous diode and its negative end is connected to the positive end of the next diode, with the positive end of the first diode being connected to the first system voltage line and the negative end of the last diode being connected to the gate of the MOS transistor.

4. The circuit of claim 1, wherein the first polydiode and the second polydiode in each stage are implemented from a finger-type polydiode structure formed over a silicon dioxide layer.

5. The circuit of claim 4, wherein the silicon dioxide layer is formed over a semiconductor substrate.

6. The circuit of claim 1, wherein the second stage of polydiode circuit is connected directly to the input side of the internal circuit of the IC device.

7. The circuit of claim 1, wherein the power protection circuit includes:
   a MOS transistor whose source is connected to the first system voltage line and whose drain is connected to the second system voltage line; and
   a resistor having a first end connected to the gate of the MOS transistor and a second end connected to the second system voltage line.

8. The circuit of claim 1, wherein the power protection circuit includes:
   a first MOS transistor whose source is connected to the first system voltage line and whose drain is connected to the second system voltage line;
   a first resistor having a first end connected to the gate of the first MOS transistor and a second end connected to the second system voltage line;
   a second MOS transistor whose source is connected to the first system voltage line and whose drain is connected to the second system voltage line;
   a second resistor having a first end connected to the gate of the second MOS transistor and a second end connected to the second system voltage line; and
   a cascaded diode circuit having a positive end connected to the first system voltage line and a negative end connected to the gate of the first MOS transistor for providing voltage stability.

9. A multi-stage polydiode-based ESD protection circuit provided between a bonding pad and the internal circuit of an IC device for the purpose of protecting the internal circuit of the IC device against any ESD voltage applied to the bonding pad; the multistage polydiode-based ESD protection circuit comprising:
   a plurality of stages of polydiode circuits, each stage including a first polydiode and a second polydiode, the first polydiode having a positive end corrected to a connecting node and a negative end connected to a first system voltage, and the second polydiode having a positive end connected to a second system voltage lower in level than the first system voltage and a negative end connected to the connecting node, with the connecting node in the first stage of polydiode circuit being connected to the bonding pad and the connecting node in the last stage of polydiode circuit being connected to the internal circuit of the IC device, wherein the first polydiode and the second polydiode in each of the stages of polydiode include a $P^+$ part, an $N^+$ part, and an $N^-$ part with a width disposed between the $P^+$ part and the $N^+$ part, wherein the width for each of the stages of polydiode is descending;
   a plurality of resistors, each being used to connect one stage of polydiode circuit to the next stage of polydiode circuit in such a manner as to be connected between the connecting node of one stage of polydiode circuit and the connecting node of the next stage of polydiode circuit; and
   a power protection circuit, connected between the first system voltage line and the second system voltage line, for draining ESD current on the first system voltage line to the second system voltage line.

10. The circuit of claim 9, wherein the power protection circuit includes:
    a MOS transistor whose source is connected to the first system voltage line and whose drain is connected to the second system voltage line;
    a resistor having a first end connected to the gate of the MOS transistor and a second end connected to the second system voltage line; and
    a cascaded diode circuit having a positive end connected to the first system voltage line and a negative end connected to the gate of the MOS transistor for providing a substantially fixed gate voltage to the MOS transistor.

11. The circuit of claim 10, wherein the cascaded diode circuit includes a plurality of serially-connected diodes, each being connected in such a manner that its positive end is connected to the negative end of the previous diode and its negative end is connected to the positive end of the next diode, with the positive end of the first diode being connected to the first system voltage line and the negative end of the last diode being connected to the gate of the MOS transistor.

12. The circuit of claim 9, wherein the first polydiode and the second polydiode in each stage are implemented from a finger-type polydiode structure formed over a silicon dioxide layer.

13. The circuit of claim 12, wherein the silicon dioxide layer is formed over a semiconductor substrate.

14. The circuit of claim 9, wherein the power protection circuit includes:
    a first MOS transistor whose source is connected to the first system voltage line and whose drain is connected to the second system voltage line;
    a first resistor having a first end connected to the gate of the first MOS transistor and a second end connected to the second system voltage line;
    a second MOS transistor whose source is connected to the first system voltage line and whose drain is connected to the second system voltage line;
    a second resistor having a first end connected to the gate of the second MOS transistor and a second end connected to the second system voltage line; and
    a cascaded diode circuit having a positive end connected to the first system voltage line and a negative end connected to the gate of the first MOS transistor for providing voltage stability.

15. The circuit of claim 9 wherein the power protection circuit includes:
    MOS transistor whose source is connected to the first system voltage line and whose drain is connected to the second system voltage line; and
    a resistor having a first end connected to the gate of the MOS transistor and a second end connected to the second system voltage line.

16. The circuit of claim 9 wherein the second stage of polydiode circuit is connected directly to the input side of the internal circuit of the IC device.

17. An ESD protection circuit provided between a bonding pad and the internal circuit of an IC device for the purpose of protecting the internal circuit of the IC device against any ESD voltage applied to the bonding pad; the 2-stage polydiode-based ESD protection circuit comprising:
    a first stage of polydiode circuit including a first polydiode and a second polydiode, the first polydiode having a positive end connected to a first node connected to the bonding pad and a negative end connected to a first system voltage, and the second polydiode having a positive end connected to a second system voltage lower in level than the first system voltage and a negative end connected to the first node;
    a resistor having a first end connected to the first node and a second end connected to a second node;

a second stage of polydiode circuit including a first polydiode and a second polydiode, the first polydiode having a positive end connected to the second node and a negative end connected to the first system voltage, and the second polydiode having a positive end connected to the second system voltage and a negative end connected to the second node; and a power protection circuit, connected between the first system voltage line and the second system voltage line, for draining ESD current on the first system voltage line to the second system voltage line, wherein the power protection circuit includes:

a MOS transistor whose source is connected to the first system voltage line and whose drain is connected to the second system voltage line;

a resistor having a first end connected to the gate of the MOS transistor and a second end connected to the second system voltage line; and a polydiode-based cascaded diode circuit having a positive end connected to the first system voltage line and a negative end connected to the gate of the MOS transistor for providing a substantially fixed gate voltage to the MOS transistor.

* * * * *